(12) United States Patent
Scherer et al.

(10) Patent No.: US 6,515,292 B1
(45) Date of Patent: Feb. 4, 2003

(54) HIGH RESOLUTION ELECTRON PROJECTION

(75) Inventors: Axel Scherer, Pasadena, CA (US); Elena Vuckovic, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/315,118

(22) Filed: May 19, 1999

Related U.S. Application Data

(60) Provisional application No. 60/086,040, filed on May 19, 1998.

(51) Int. Cl.[7] ................................................. G21K 5/10
(52) U.S. Cl. ................................. 250/492.24; 430/296
(58) Field of Search ......................... 250/492.24, 492.2, 250/492.3; 430/296

(56) References Cited

U.S. PATENT DOCUMENTS

| | | | | |
|---|---|---|---|---|
| 3,745,358 A | * | 7/1973 | Firtz et al. .............. | 250/492.24 |
| 3,879,613 A | * | 4/1975 | Scott et al. ............. | 250/492.24 |
| 5,294,801 A | * | 3/1994 | Aton et al. ............. | 250/492.22 |
| 5,395,738 A | * | 3/1995 | Brandes et al. .......... | 430/296 |

* cited by examiner

*Primary Examiner*—Jack Berman
(74) *Attorney, Agent, or Firm*—Fish & Richardson P.C.

(57) ABSTRACT

A photocathode electron projector is formed with a sample attached to an anode and a patterned quartz mask attached to a cathode. The quartz mask is patterned with Au—Pd layers that emit electrons when illuminated by ultraviolet light. The ultraviolet light is filtered to just above the work function of the Au—Pd material. This has the effect of causing substantially monochromatic electrons to be emitted. The electrons are brought under influence of a parallel electric and magnetic field to thereby undergo a cyclotronic orbit. An integer number of cyclotronic orbits insures that the electrons hit the sample substantially at the same location as they were on mask.

38 Claims, 4 Drawing Sheets

HIGH RESOLUTION ELECTRON PROJECTION

CROSS REFERENCE TO RELATED APPLICATIONS

This application claims the benefit of U.S. Provisional Application No. 60/086,040, filed on May 19, 1998.

BACKGROUND

The size of a semiconductor often relies on small lines and features being formed on a semiconductor substrate such as silicon. Processes such as lithography and pattern transfer are often used to form such small features on the silicon backbones. Many of these techniques have a resolution that is limited to the wavelength of the illuminating radiation. Many techniques for forming small lines require a totally new technology for forming the mask. For example, techniques have been suggested based on x-ray or high energy electron projection. These techniques may require the construction of complex and expensive sources, and may be dependent on either high mass/thickness contrast thin-film masks or expensive multilayer x-ray reflecting masks. Presently, the technology required to produce adequate masks, such as microplating, anisotropic etching, and construction of large unstrained membranes requires enormous efforts for further reductions in feature sizes.

Photocathode electron projection lithography was first proposed in the 1970's as a way to generate large areas of sub-micron patterns. Projector systems were demonstrated and built, and were able to successfully print features in the 0.5 micron range. Typically, these systems used high power levels and low level magnetic fields—e.g., 20 keV accelerating voltages and magnetic fields of 0.1 Tesla.

In 1995, a group at AT&T Bell Laboratories reported results of a pilot study using lower energy electrons and higher magnetic fields, using gold as a photocathode. This system, however, still had certain problems, including sample heating, proximity effects, electrostatic charging and resist sensitivity.

SUMMARY

The present technique defines a new way of carrying out photocathode electron projection lithography to effect a pattern transfer which enables reducing the size of the eventual lines and features on the semiconductor device. This is carried out in a new way which avoids damage to the wafer being patterned. The system leverages off existing mask formation technology to form a system that can make sub-wavelength features.

The present system describes new materials that are used, new parameters for the process, and new techniques of operation. These features enable the technology to operate in an improved way. One such technique includes emitting a substantially monochromatic electron. Another technique uses an integer number of cyclotronic orbits, preferably 1 orbit. Yet another technique uses fields less than 5 Kev, and magnetic fields greater than 1.5 Tesla.

Unlike other proposed techniques, the masks that are proposed according to the preferred embodiment need only very thin layers of chromium to block the ultraviolet radiation source. These masks can be patterned with standard electron beam mask-making processes. As such, they can leverage off technology already in place from most e-beam mask vendors. Further reductions in feature sizes over large areas in the master masks are therefore mainly dependent on the fidelity of beam-written lithographic patterns, and do not require a complex pattern transfer processes. In modern direct electron-beam lithography systems, these dimensions can approach 30 nm.

BRIEF DESCRIPTION OF THE DRAWINGS

These and other aspects will now be described with reference to the accompanying drawings wherein.

DESCRIPTION OF THE PREFERRED EMBODIMENTS

Figure 1:
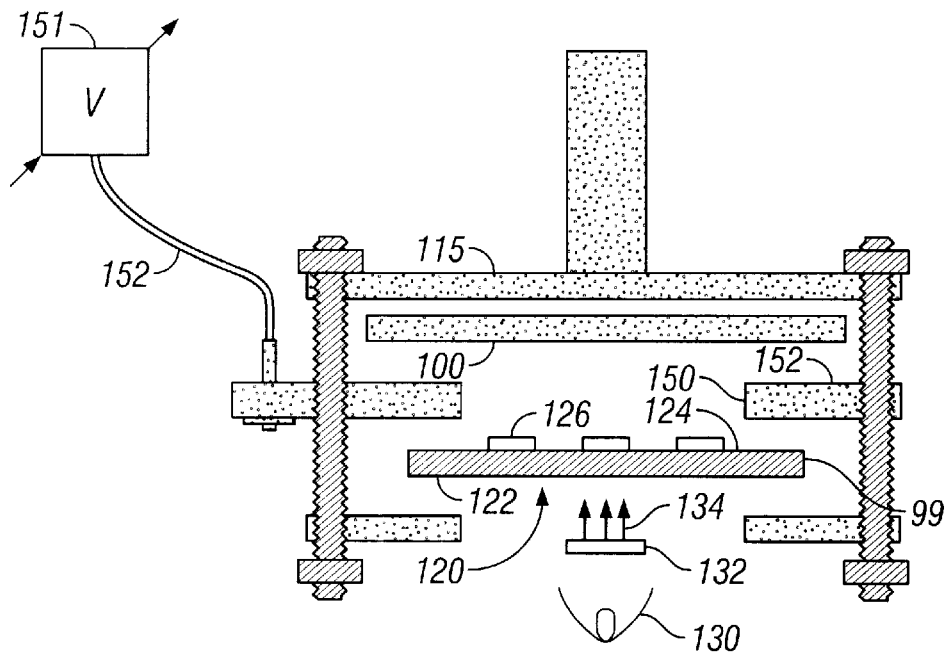
FIG. 1 shows an exploded view of the parts of the overall photocathode projection system.
Figure 2:
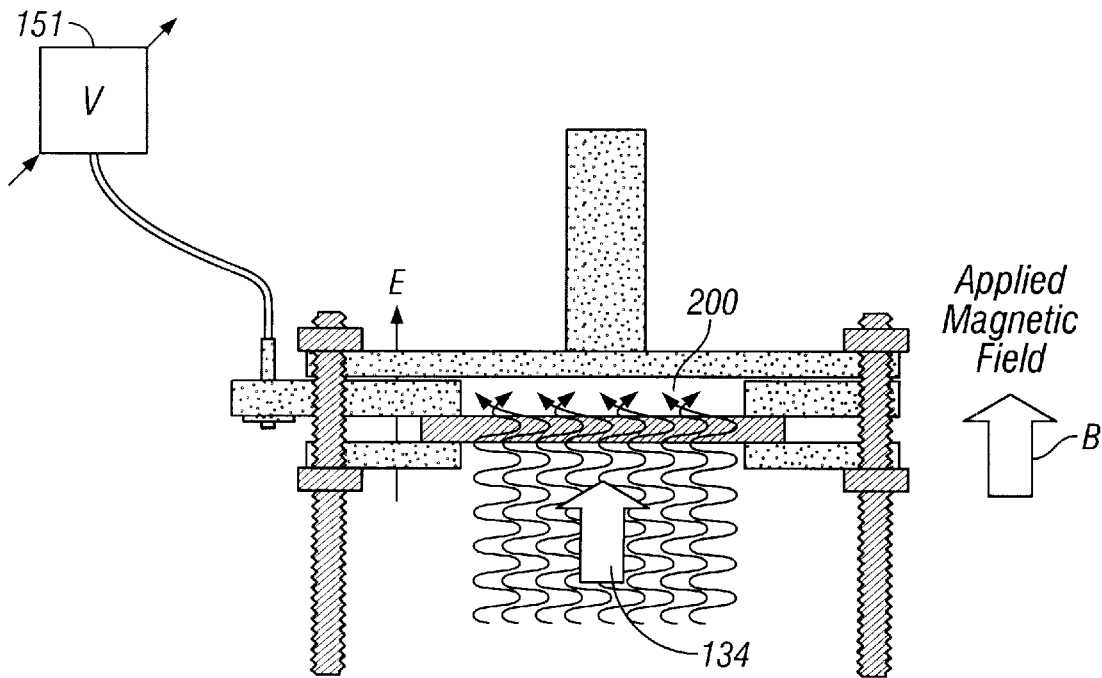
FIG. 2 shows an assembled view of the operating photo cathode projection system.

A basic embodiment of the photocathode electron projector is shown in FIGS. 1 and 2, where FIG. 1 shows an exploded view of the parts that form the projector, and FIG. 2 shows the assembled and operating device. Electrons are used to transfer a pattern from a photocathode to an electron resist-coated sample, e.g. a wafer 100. In this system, an anode 115 is attached to the sample 100. Cathode 150 is coupled to the patterned portion 120. The anode and cathode 150 are arranged spaced from one another in a simple diode configuration.

A patterned mask is used as photoemitter 120, i.e., a device that emits electrons when irradiated by ultraviolet light. Photoemitter 120 is formed with the features which are to be transferred to the resist-coated wafer or "sample" 100. As shown in FIG. 2, a 3 Kev acceleration voltage is applied to cathode 150, and conducted to patterned surface 124. The patterned surface is electrically connected to the bias voltage, and hence effectively becomes the cathode surface.

A glass spacer 150 has a gold coated surface 152 to stand off the electron acceleration voltage, typically 2–5 KeV field, most preferably approximately a 3 KeV field, shown applied at 152 to the cathode 150.

The patterned masks are preferably formed from gold-palladium (Au—Pd). Au/Pd requires lower wavelength UV sources than pure Au and therefore can produce smaller features.

The photoemitter 120 is formed by a quartz mask that includes an irradiation receiving surface 122, and a coated and patterned front surface 124. The actual substrate 99 can be quartz or any other ultraviolet-transmissive material. The front surface 124 is preferably coated with a Cr/Au pattern covered with Au/Pd forming features to be transferred. The irradiation receiving surface 122 is illuminated by filtered ultraviolet light 134 from an ultraviolet light source 130 which is filtered through a filter 132. The ultraviolet light source can be the same type used in UV lithography.

The filtered ultraviolet light 134 passes through the photoemitter 120 under an acceleration field from the electrostatic field generated between the anode and cathode. Electrons 200 are emitted at the patterned surface 124. Those electrons are accelerated by the electrostatic fields, and are used to selectively expose the resist on the sample 100.

This operation is a lithography in the sense that the electrons form a pattern based on the pattern that is formed on patterned surface 124. The accelerated ultraviolet photons preferably have energies that are at least slightly higher than the work function of the metal coating 126 on the surface 124. The electrons 200 preferably have large enough energies to penetrate the resist layer on the sample 100 when reaching the sample.

The emitted electrons are also focused by a magnetic field B that is parallel to the electric field. This focusing can be helpful to avoid edge effects from the finite tangential velocities of the emitted electrons. Hence parallel magnetic fields B and electric fields E accelerate the electrons 200. This causes the electrons to undergo a circular harmonic motion. For example, this may result in a cyclotronic orbit in a perpendicular direction to the fields.

The strength of the fields are preferably set such that the electrons 200 have an integer number of cyclotronic orbits between the cathode surface 124 and the anode, preferably one cyclotronic orbit. In this way, the electron lands on the surface at substantially the same location as it was emitting from the mask.

FIG. 2 shows the electron emissions 200 and their cyclotronic orbits. Ideally the electrons that are emitted from a point on the cathode surface 124 are imaged to a corresponding point on the sample 100 on the anode, preferably in the sensitive resist portion coupled to the anode.

After the sample is exposed, it can be developed, and the resist pattern can then be transferred to a more robust sample or used directly as a mask.

Higher energy photons are more likely to generate an electron when hitting the photoemitter material. However, more energetic electrons will have varying energies which can cause chromatic aberrations. Feature resolution in this system is directly affected by chromatic aberration caused by variation of emission energies of the photoelectrons. The present system trades off the brightness obtained from more energetic electrons for uniformity.

The preferred embodiment uses substantially a single photoelectron emission energy. By doing so, the present system obtains substantially monochromatic electrons, e.g. within 5–10% of one another, more preferably within 1–2% of one another. A preferred mode filters the ultraviolet radiation to obtain the monochromatic electrons. These electrons have energies which are just above the work function frequency of the photoemitting substance. The work function is the lowest energy at which an electron will be emitted from the photoemitter. Hence, this obtains substantially only a single photoelectron emission energy, or at least emission energies within 5–10%, more preferably within 2% or 1%, of the work function of the metal in the pattern.

The results may also be improved by minimizing the distance between the source and the sample. A typical distance between source and sample could be one cyclotron orbit. At 3 KeV, and a magnetic field of 1.46 Tesla, a cyclotron orbit is about 1.27 mm.

A 1.4 Tesla magnet or greater is preferred. A higher strength magnet reduces the radius of the cyclotronic orbit. A smaller radius cyclotronic orbit has less movement as a function of height. In effect, this creates a longer depth-of-field.

The inventors also found that pattern resolution is deleteriously affected by poor mechanical stability within the source/sample exposure system during exposure. Resolution is also decreased by non-uniformity of the magnetic field. Preferably, a highly uniform modern superconducting magnetic is used for this purpose, e.g. the kind of magnet now used for medical NMR.

Figure 3A:
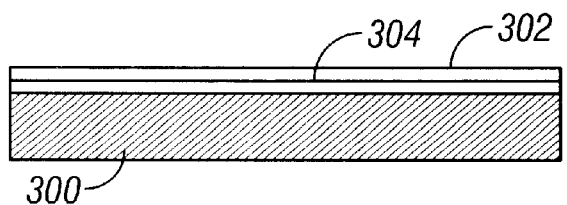
FIGS. 3A–3E show steps of the method used for forming the emitter mask.

The basic system uses a number of additional features which are described herein. The electron emitter mask 124 has special properties. The preferred formation process of this mask is shown in FIGS. 3A–3E. FIG. 3A represents the initial step. A quartz mask substrate 300 is first covered with a 950 nm thick layer of Au/Cr, which is used as a mask layer on the substrate using standard chromium mask formation techniques. This is covered with a 70 nm resist overlayer of polymethylmethacrylate "PMMA" forming the mask 304.

Figure 3B:
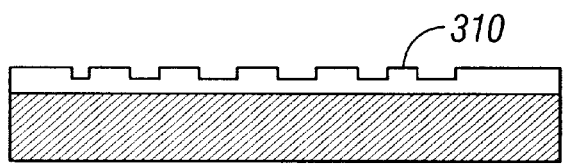
Figure 3C:
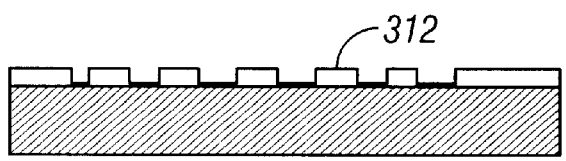
Figure 3D:
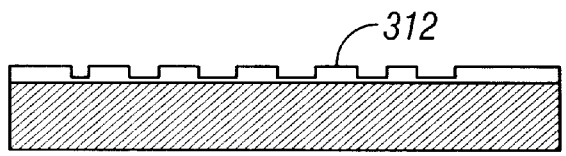
Figure 3E:
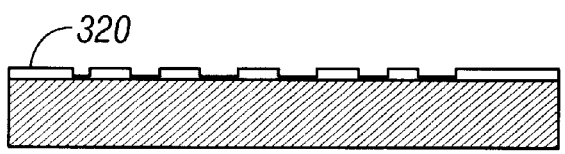

In FIG. 3B, the PMMA mask 304 is exposed to form features 310. The underlying Au layer is ion milled in FIG. 3C, forming gold features 312. Using techniques of standard electron beam lithography, the residual PMMA is then removed as shown in FIG. 3C to leave features of Au (gold) on the surface. A 20 nm thick sputter-deposited gold-palladium (Au—Pd) electron emitting layer 320 is finally formed on the surface.

It is contemplated that deterioration of the electron emission efficiency could eventually be observed on the gold is palladium emitter coating. If so, then low voltage oxygen plasma etching of this surface can be used for cleaning.

The system shown in FIGS. 1 and 2 has so far demonstrated patterns of approximately 100 nm for lines, and 300 nm for spaced gratings. The material used was a PMMA resist at 3 keV.

One disadvantage of using low acceleration voltages is the associated need to use thin resist coated on the sample 100. This often limits the usefulness of the resist as an etch mask or lift-off mask for further processing, since the film itself is relatively thin.

Mask amplification techniques can be used to transfer the high resolution pattern from the resist layer on to a robust mask. A multilayer mask arrangement has been used for this purpose.

The mask amplification is carried out by depositing layers of more robust materials on the wafer. These robust materials can include Au, $SiO_2$, and Ni. After the materials are supplied, a thin layer of high resolution positive resist, such as PMMA, is deposited on the wafer. The positive resist is exposed and developed, and then used as a mask to selectively etch the underlying layers of robust materials using a sequence of ion milling and reactive ion etching. Similar multilevel resist schemes can be carried out using polyimide and germanium layers as is known in the art.

An alternative technique, originally developed at IBM for planar DUV lithography, uses surface silation of novolac-based resists. In this technique, surface bonding of the resist is altered by electron beam irradiation. This changes the rate of diffusion of the silicon-containing compounds into the surface of the resist. The sample is subsequently oxygen ion etched, and the silicon-diffused areas are effectively masked by a thin silicon dioxide layer.

Figure 4:
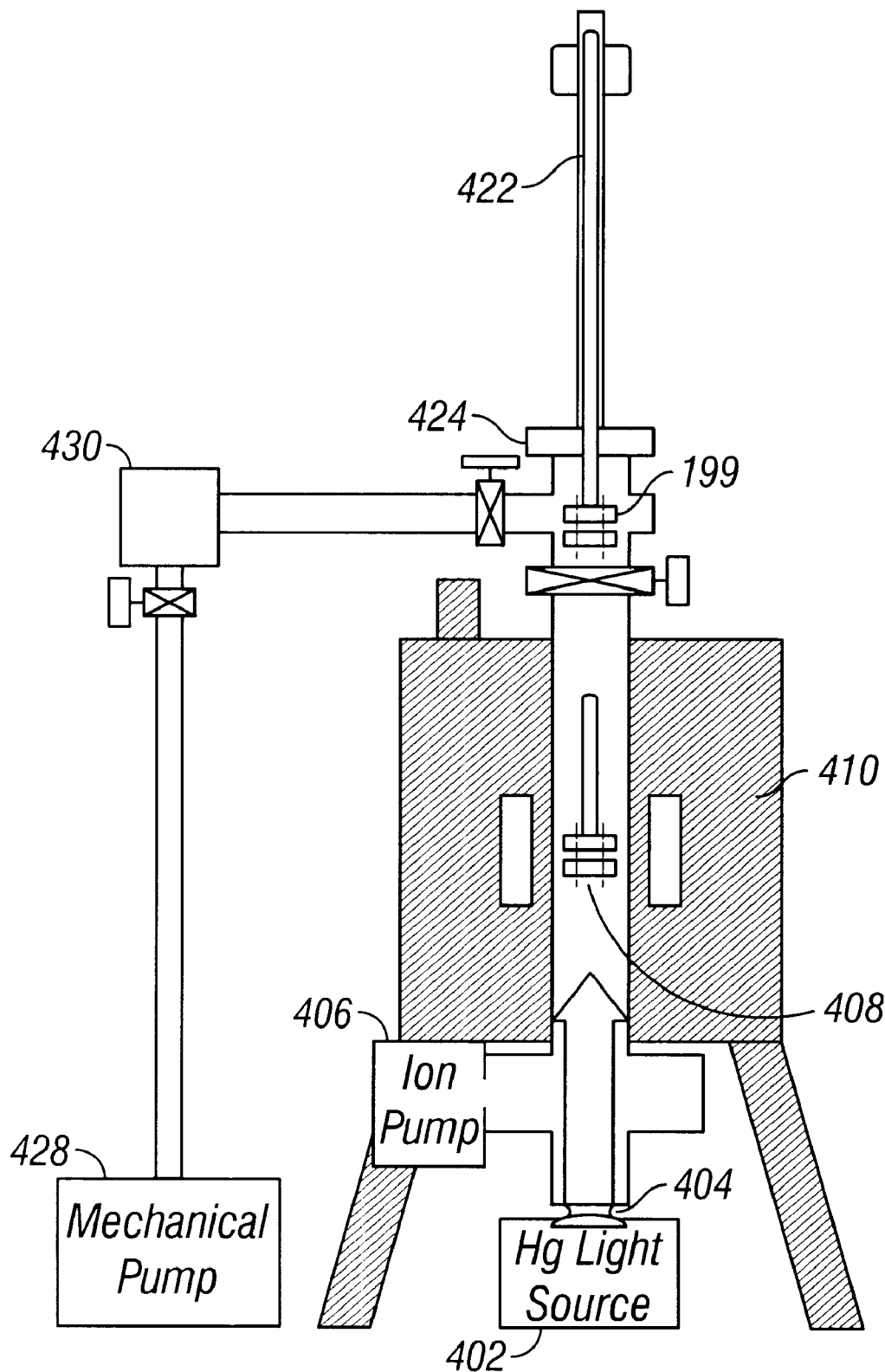
FIG. 4 shows the overall system.

The device of FIG. 4 is a locked-transfer system which can be used to effect pattern transfer as described above. The electron exposure shown in FIG. 2 is preferably carried out under vacuum. The vacuum permits larger mean-free paths for the photoemitted electrons, and also minimizes mask contamination and prevents electrostatic arcing. Electron emission intensity and exposure doses are made more reproducible if the gold surface is kept clean.

First, the "sandwich" 199 including the structure of FIG. 2 is positioned into the bore 408 of a magnet 410. The magnet can be, for example a niobium alloy superconducting magnet used in NMR. A mercury light source 402 is used to produce ultraviolet irradiation via a sapphire window 404.

The light is directed through the bore 408 of the superconducting magnet 410. A magnetically-coupled feed-through 422 is used for positioning the sample 199 in the bore 408, and for removing and re-locating a new sample in the bore. Vacumn is maintained by pumps 428, 430 and can be selectively interrupted via valves.

Figure 5:
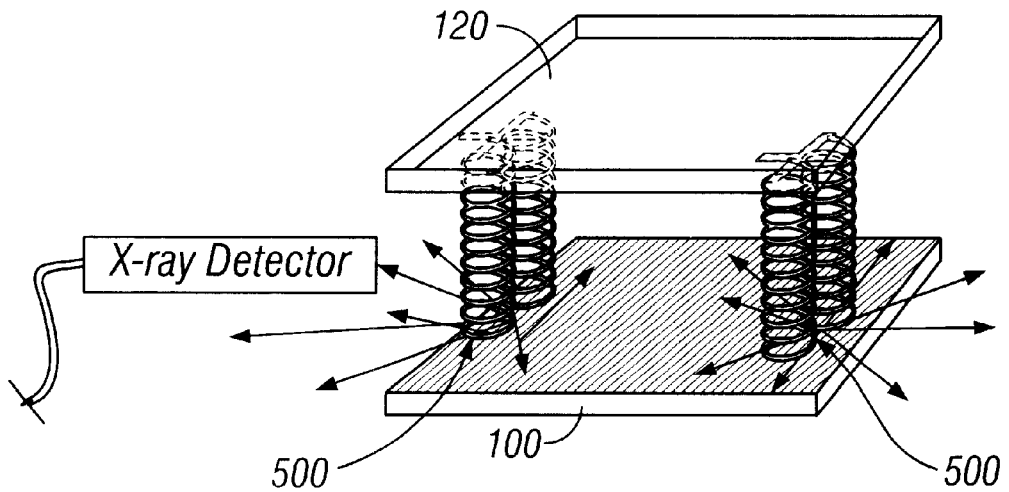
FIG. 5 shows a technique of alignment.

Alignment between the positions of the photoemitter mask 120 and the sample wafer 100 can be extremely important. An alignment technique is illustrated in FIG. 5. This system uses detection indicia. Micromachined 250 $\mu$m via-holes are formed through the silicon wafer 100 that is to be exposed. Alignment marks are also formed in the mask 120. The alignment marks in the mask can be, for example, in the shape of a cross "+". This shape is optimized to cause high signal gradients when scanning is aligned. A p-n diode 500 can be placed below the sample surface. The diode produces current when illuminated by the [illumination] electrons passing through both indicia in the mask and in the sample.

Alignment is achieved by scanning the alignment marks over the holes, analyzing the alignment response, and then determining signal levels on both sides of the peak signal. A cross can produce high levels when aligned and lower levels when not aligned. The system has been found to have +/−0.2 $\mu$m alignment with about a 3$\sigma$ deviation.

An alternate system puts the P-N junction directly on the sample surface so that the position of the P-N junction becomes the position of alignment.

An alternate system uses excitation of characteristic x-rays from the sample surface. Evaporated or sputter-deposited layers are used which form characteristic x-rays when irradiated by electrons. The x-ray signals are filtered, and then measured with a dispersive x-ray detector. The signal strength is then maximized to optimize the sample-to-source alignment. Other detector elements on the sample can alternately be used.

Figure 6:
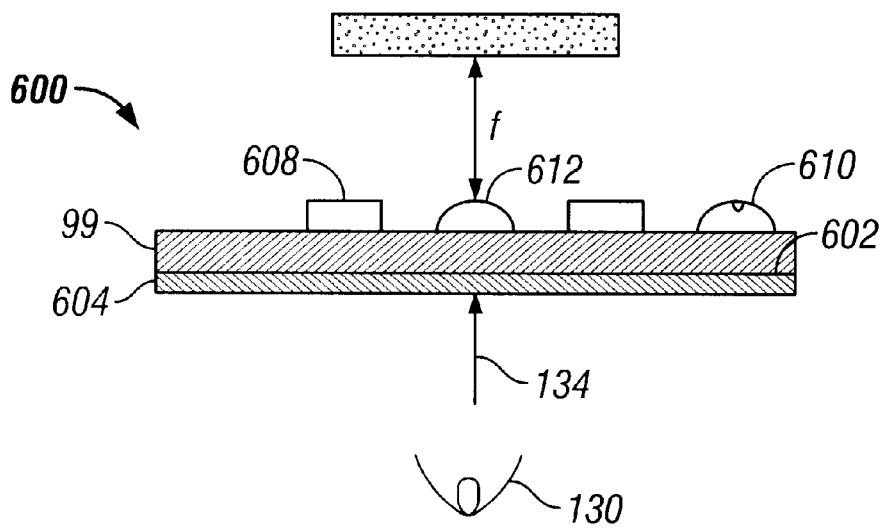
FIG. 6 shows an alternative mask.

FIG. 6 shows an alternative mask which includes an integral ultraviolet filter element. The quartz substrate 99 is covered at the illumination receiving surface 602 by dielectric layer 604, which forms a Fabry-Perot filter that filters the ultraviolet radiation 134 from the ultraviolet source 130. Use of the ultraviolet filter on the bottom surface of the mask 600 enjoys certain advantages. A first advantage is since the filter can be over the entire surface of the mask, the filter is actually larger than the filter used in the first embodiment. Hence better filtering characteristics and better resolution can often be obtained. The filter on the sample can also provide better intensity emission since there is one fewer air-to-element boundary. Moreover, since the mask 600 is already complicated and expensive, the additional structure needed for the mask can be minimal. This mask also includes additional optical elements thereon. For example, diffractive optical element 610 can include an element such as a lens or a zone plate. The element 610 can have focal length F which can be tuned to a desired length.

The voltage applied via 152 to the cathode can also be variable as shown by variable source 151. Any change in the wavelength of the light can change characteristics of the cyclotronically-orbiting electrons. Adjustment of the electrostatic value by adjusting the variable source 151 can be used to compensate for the optimum desired distance from the mask to the sample.

Although only a few embodiments have been described in detail above, other embodiments are contemplated by the inventor and are intended to be encompassed within the following claims. In addition, other modifications are contemplated and are also intended to be covered.

What is claimed is:

1. A photocathode electron projector device, comprising:

a photoemitter mask, having a first illumination receiving surface, an ultraviolet filter coupled to said illumination receiving surface, and a second patterned surface, patterned with a material that emits electrons when illuminated;

a first electrode, having a portion adapted to connect to a sample to be patterned;

an electric field generating device, generating an electric field between said photoemitter mask and said first electrode;

a magnetic field generator, forming a magnetic field that is applied to an area of said electric field such that electrons emitted from said patterned surface undergo a cyclotronic orbit; and a radiation source producing illumination for said mask, arranged in a way such that said electrons emitted by said mask are substantially monochromatic and have energies within two percent of one another.

2. A device as in claim 1 wherein said radiation source includes an ultraviolet source.

3. A device as in claim 1 wherein said patterned portion is formed of a photoemitting substance.

4. A device as in claim 3 wherein said photoemitting substance is a combination of gold and palladium.

5. A device as in claim 1 wherein said mask is spaced from said anode from an amount effective to cause said electrons to undergo an integer number of cyclotronic orbits.

6. A device as in claim 1 wherein said electric field applied is less than 5 keV.

7. A device as in claim 1 wherein said electric field applied is between 3 and 4 KeV.

8. A device as in claim 7 wherein said magnetic field generator is a magnet producing a magnetic field of least 1.4 Tesla.

9. A device as in claim 1 wherein said photoemitter mask has a quartz substrate.

10. A device as in claim 1 wherein the electric field, magnetic field, and said distance between photoemitter mask and said first electrode are set such that one single cyclotronic orbit occurs before said electrons strike the sample surface.

11. A device as in claim 1 further comprising an superconducting magnet forming said magnetic field.

12. A device as in claim 1 further comprising means for aligning said photoemitter mask with said first electrode.

13. A device as in claim 1 further comprising a sample coupled to said first electrode, having an etchable layer thereon.

14. A device as in claim 13 further comprising a spacer element between said mask and said sample.

15. A device as in claim 1, wherein the photoemitter mask further includes an optical element on the second patterned surface, said optical element being operative to focus ultraviolet light received at the illumination receiving surface and filtered by the ultraviolet filter.

16. A device as in claim 15, wherein the optical element has a focal length.

17. A device as in claim 16, wherein the focal length is tunable.

18. A device as in claim 15, wherein the optical element comprises a lens.

19. A device as in claim 15, wherein the optical element comprises a zone plate.

20. A photocathode electron projector device, comprising:
- a photoemitter mask, having a first illumination receiving surface, an ultraviolet filter coupled to said illumination receiving surface, and a second patterned surface, patterned with a material that emits electrons when illuminated;
- a first electrode, having a portion adapted to connect to a sample to be patterned;
- an electric field generating device, generating an electric field between said photomitter mask and said first electrode;
- a magnetic field generator, forming a magnetic field that is applied to an area of said electric field such that electrons emitted from said patterned surface undergo a cyclotronic orbit; and
- a radiation source producing illumination for said mask, arranged in a way such that said electrons emitted by said mask are substantially monochromatic, wherein said radiation source and the ultraviolet filter are effective to produce a radiation amount impinging on said patterned portion which is within two percent of and just above a work function of a material of said patterned portion.

21. A photocathode electron projector device, comprising:
- a photoemitter mask, having a first illumination receiving surface, an ultraviolet filter coupled to said illumination receiving surface, and a second patterned surface, patterned with a material that emits electrons when illuminated;
- a first electrode, having a portion adapted to connect to a sample to be patterned;
- an electric field generating device, generating an electric field between said photoemitter mask and said first electrode;
- a magnetic field generator, forming a magnetic field that is applied to an area of said electric field such that electrons emitted from said patterned surface undergo a cyclotronic orbit;
- a radiation source producing illumination for said mask; and
- an indicia formed on said photoemitter mask operating to align said photoemitter mask with said first electrode, and a detector operative to detect electrons emitted from said indicia,
- wherein said detector is formed on said sample.

22. A device as in claim 21 wherein said indicia has a cross and said detector is a semiconductor PN junction.

23. A method of transferring a pattern from a mask to a sample, comprising:
- defining a patterned portion on a substrate, said patterned portion formed of a photoemitting material which emits electrons when illuminated;
- forming an ultraviolet filter layer on an illumination receiving surface of said substrate;
- forming a electric field and a magnetic field which is parallel to said electric field;
- illuminating the patterned portions with an illumination through said ultraviolet filter layer to cause said patterned portions to emit monochromatic electrons that have energies with two percent of each other, and which are accelerated into cyclotronic orbits by said magnetic and electric fields; and
- setting magnitudes of said fields and spacing between said mask and sample to pattern the sample after substantially an integer number of cyclotronic orbits.

24. A method as in claim 23, wherein said number of cyclotronic orbits equal 1.

25. A method as in claim 23 wherein said illuminating comprising obtain ultraviolet illumination and filtering the ultraviolet illumination.

26. A method as in claim 25 wherein said filtering comprises filtering the illumination to a level just above a work function of the photoemitting material.

27. A method as in claim 26 wherein said level is less than 10% above the work function.

28. A method as in claim 23 wherein said electric field is less than 5 KeV and said magnetic field is greater than 1.5 Tesla.

29. A method as in claim 23 wherein said photoemitting substance is Au—Pd.

30. A method as in claim 23 further comprising aligning said mask and said sample.

31. A method as in claim 23 further comprising forming substantially monochromatic electrons.

32. A method of transferring a pattern from a mask to a sample, comprising:
- defining a patterned portion on a substrate, said patterned portion formed of a photoemitting material which emits electrons when illuminated;
- forming an ultraviolet filter layer on an illumination receiving surface of said substrate;
- forming a electric field and a magnetic field which is parallel to said electric field;
- illuminating the patterned portions with an illumination to cause said patterned portions to emit monochromatic electrons that have energies with two percent of each other, and which are accelerated fields;
- setting magnitudes of said fields and spacing between said mask and sample to pattern the sample after substantially integer number of cyclotronic orbits; and
- aligning said mask and said sample, wherein said aligning compromises forming an indicia on said mask, detecting on a surface of said sample facing the mask, and detecting a position of said indicia relative to said sample.

33. A method as in claim 32 wherein said indicia includes a cross.

34. A photocathode electron projector, comprising:
- a mask having a patterned photoemitter substance on a first surface, an ultraviolet filter coupled to a second surface, and an indicia used in aligning said mask relative to a desired sample;
- a sample holding area, spaced from said mask;
- an electric field and a magnetic field, where said spacing, said electric field and said magnetic field are set such that photoemitted electrons from said mask traveling a substantially integer number of cyclotronic orbits prior to reaching said mask;

an ultraviolet source, producing ultraviolet radiation, wherein the ultraviolet filter coupled to the second surface of the mask filters the ultraviolet radiation to have energies within two percent of one another and to be greater than, but not more than 2% greater than, a work function of said photoemitting substance.

35. A device as in claim 34 wherein said photoemitting substance is Au—Pd.

36. A projector as in claim 34 wherein said integer number of orbits is 1.

37. A projector as in claim 34 further comprising means for adjusting the electrons that are emitted to be substantially monochromatic.

38. A projector as in claim 34 further comprising an ultraviolet source, producing ultraviolet radiation, and a filter for the ultraviolet radiation which filters the ultraviolet radiation to substantially a level of a work function of said photoemitting substance.

* * * * *